US012740195B2

(12) United States Patent
Song et al.

(10) Patent No.: US 12,740,195 B2
(45) Date of Patent: Sep. 15, 2026

(54) DISPLAY DEVICE

(71) Applicant: LG Display Co., Ltd., Seoul (KR)

(72) Inventors: TaeJoon Song, Paju-si (KR); ChulHo Kim, Incheon (KR); YunHo Kook, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 407 days.

(21) Appl. No.: 18/503,572

(22) Filed: Nov. 7, 2023

(65) Prior Publication Data

US 2024/0222557 A1 Jul. 4, 2024

(30) Foreign Application Priority Data

Dec. 30, 2022 (KR) ........................ 10-2022-0190928

(51) Int. Cl.

| | |
|---|---|
| ***H10H 20/831*** | (2025.01) |
| ***G06F 3/041*** | (2006.01) |
| ***H10H 20/832*** | (2025.01) |
| ***H10H 20/854*** | (2025.01) |
| ***H10K 59/12*** | (2023.01) |
| ***H10K 59/40*** | (2023.01) |

(52) U.S. Cl.

CPC ......... *H10H 20/831* (2025.01); *G06F 3/0412* (2013.01); *H10H 20/835* (2025.01); *H10H 20/854* (2025.01)

(58) Field of Classification Search

CPC ...... H10K 59/40; H10K 59/12; H10K 59/875; H10K 59/878; H10K 59/122; H10K 59/124; H10K 59/131; H10K 59/38; H10K 59/8051; H10K 59/8052; H10K 59/873; H10H 20/831; H10H 20/835; H10H 20/854; G06F 3/0412; G06F 3/04164; G06F 3/0443; G06F 3/0446; G06F 2203/04111; G06F 2203/04112

See application file for complete search history.

(56) References Cited

U.S. PATENT DOCUMENTS

| | | | | |
|---|---|---|---|---|
| 11,237,659 | B2 | 2/2022 | Kim et al. | |
| 11,726,594 | B2 | 8/2023 | Kim et al. | |
| 2018/0039360 | A1* | 2/2018 | Akimoto | G06F 3/0412 |
| 2018/0040672 | A1* | 2/2018 | Park | G06F 1/1643 |

(Continued)

FOREIGN PATENT DOCUMENTS

| | | | |
|---|---|---|---|
| KR | 10-2021-0012415 | A | 2/2021 |
| KR | 10-2021-0054390 | A | 5/2021 |

*Primary Examiner* — Omar F Mojaddedi

(74) *Attorney, Agent, or Firm* — Fenwick & West LLP

(57) ABSTRACT

According to an aspect of the present disclosure, a display device includes a substrate including a plurality of sub pixels; an over coating layer disposed on the substrate; an anode which is disposed on the over coating layer so as to correspond to each of the plurality of sub pixels; a bank which is disposed to cover an end of the anode between the plurality of sub pixels and has an inclined surface; a bridge electrode which is disposed on a top surface of the bank between the plurality of sub pixels and a part of the inclined surface; an organic layer disposed on the anode and the bridge electrode; a cathode disposed on the organic layer; an encapsulation unit disposed on the cathode; and a touch electrode which is disposed on the encapsulation unit so as to overlap the bridge electrode and is electrically connected to the bridge electrode.

13 Claims, 10 Drawing Sheets

(56) References Cited

U.S. PATENT DOCUMENTS

| | | | | |
|---|---|---|---|---|
| 2019/0377445 | A1* | 12/2019 | Jeong | G06F 3/04164 |
| 2021/0132723 | A1* | 5/2021 | Kim | G06F 3/0412 |
| 2021/0200357 | A1* | 7/2021 | Lee | G06F 3/0412 |
| 2021/0200363 | A1* | 7/2021 | Lee | G06F 3/0412 |
| 2022/0107700 | A1 | 4/2022 | Kim et al. | |
| 2022/0382402 | A1 | 12/2022 | Kim et al. | |

* cited by examiner

IVb
152
OP2
OP1
EA
EA1
EA2
NEA1
NEA2
NEA

DISPLAY DEVICE

CROSS-REFERENCE TO RELATED APPLICATION

This application claims the priority of Republic of Korea Patent Application No. 10-2022-0190928 filed on Dec. 30, 2022, in the Korean Intellectual Property Office, which is incorporated herein by reference in its entirety.

BACKGROUND

Field

The present disclosure relates to a display device, and more particularly, to a display device which improves a luminance viewing angle and simplifies a manufacturing process.

Description of the Related Art

Currently, as it enters a full-scale information era, a field of a display device which visually expresses electrical information signals has been rapidly developed and studies are continued to improve performances of various display devices such as a thin-thickness, a light weight, and low power consumption.

Among various display devices, a display device is a self-emitting display device so that a separate light source is not necessary, which is different from a liquid crystal display device. Therefore, the display device may be manufactured to have a light weight and a small thickness. Further, since the light emitting display device is driven at a low voltage so that it is advantageous not only in terms of power consumption, but also in terms of color implementation, a response speed, a viewing angle, a contrast ratio (CR). Therefore, it is expected to be utilized in various fields.

SUMMARY

An object to be achieved by the present disclosure is to provide a display device which is capable of improving a luminous efficiency of a light emitting diode using a side mirror type electrode.

Another object to be achieved by the present disclosure is to provide a display device which simplifies a manufacturing process and simplifies a placement structure by unifying a side mirror type electrode and a bridge electrode of a touch sensor unit.

Objects of the present disclosure are not limited to the above-mentioned objects, and other objects, which are not mentioned above, can be clearly understood by those skilled in the art from the following descriptions.

According to an aspect of the present disclosure, a display device includes a substrate including a plurality of sub pixels: an over coating layer disposed on the substrate; an anode which is disposed on the over coating layer so as to correspond to each of the plurality of sub pixels: a bank which is disposed to cover an end of the anode between the plurality of sub pixels and has an inclined surface: a bridge electrode which is disposed on a top surface of the bank between the plurality of sub pixels and a part of the inclined surface: an organic layer disposed on the anode and the bridge electrode; a cathode disposed on the organic layer; an encapsulation unit disposed on the cathode; and a touch electrode which is disposed on the encapsulation unit so as to overlap the bridge electrode and is electrically connected to the bridge electrode.

According to another aspect of the present disclosure, a display device includes: a substrate including a display area including a plurality of sub pixels: an over coating layer disposed on the substrate; a light emitting diode which is disposed on the over coating layer so as to correspond to each of the plurality of sub pixels and includes an anode, an organic layer, and a cathode: a bank which is disposed to cover an end of the anode between the plurality of sub pixels and has an inclined surface: a reflective electrode which is disposed in a part of a surface of the bank between the plurality of sub pixels: an encapsulation unit disposed on the light emitting diode; and a touch electrode which is disposed on the encapsulation unit and the reflective electrode and is electrically connected to the reflective electrode, and the reflective electrode has a first opening which overlaps the anode and the touch electrode has a second opening which overlaps the anode and is larger than the first opening.

Other detailed matters of the exemplary embodiments are included in the detailed description and the drawings.

According to the present disclosure, the light extraction efficiency of the light emitting display device may be improved using a side mirror type electrode and power consumption may be improved.

According to the present disclosure, the side mirror type electrode is used as a bridge electrode of the touch sensor unit to simplify a manufacturing process of a display device.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1A:
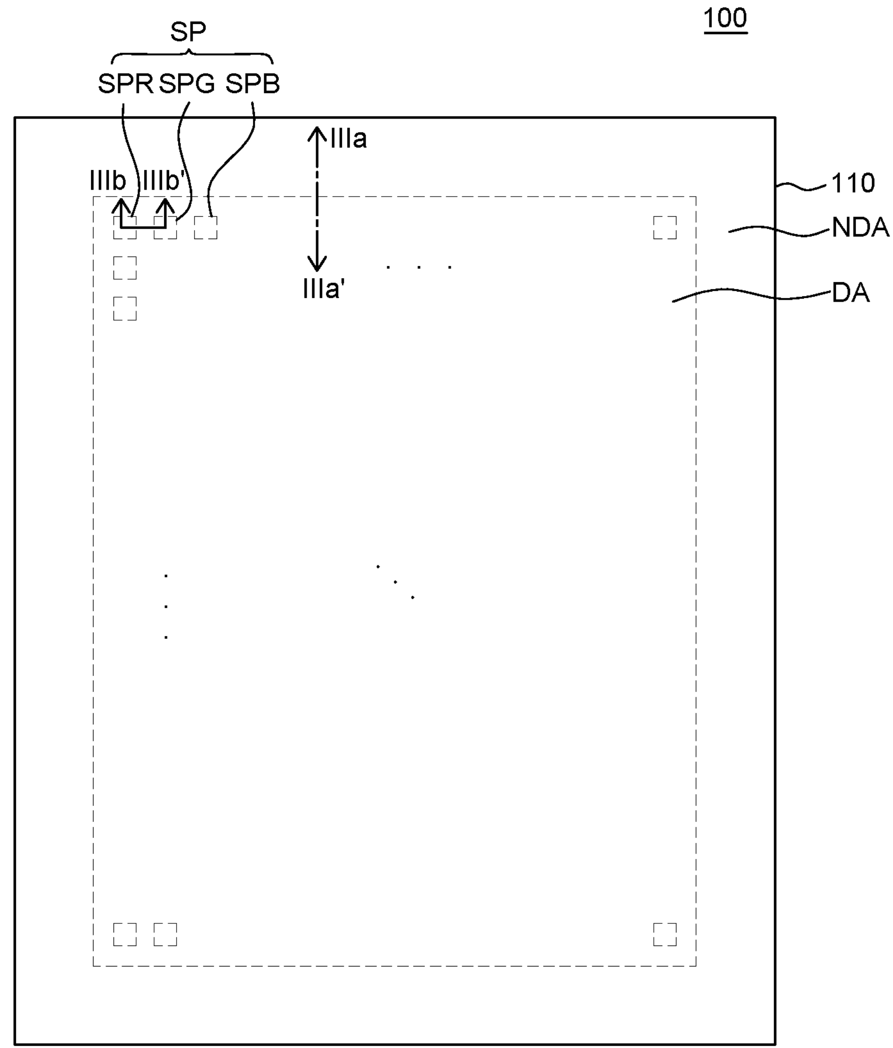
FIG. 1A is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', 'comprising' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

Figure 1B:
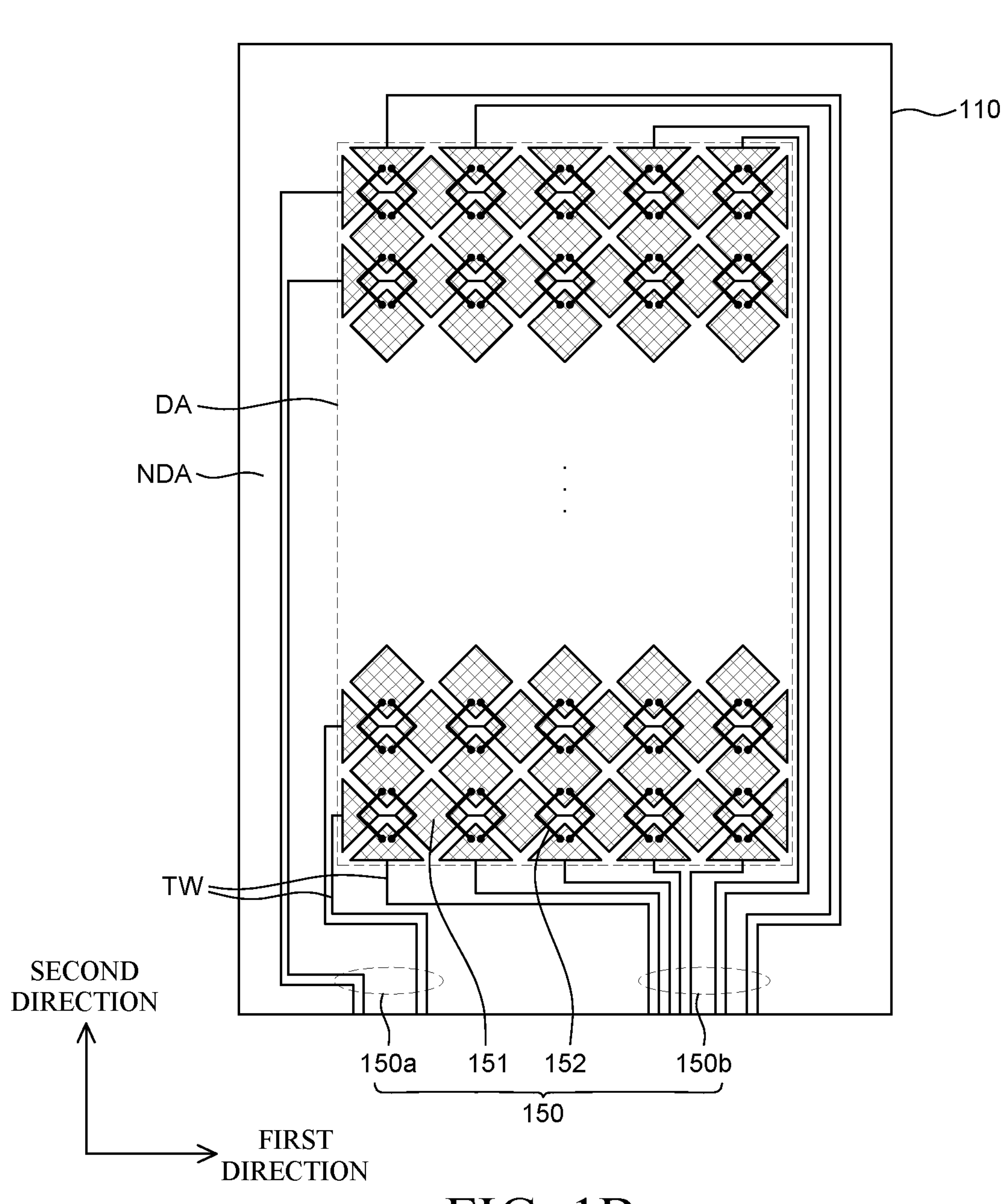
FIG. 1B is a plan view of a touch sensor unit of a display device according to an exemplary embodiment of the present disclosure.

FIG. 1A is a plan view of a display device according to an exemplary embodiment of the present disclosure. FIG. 1B is a plan view of a touch sensor unit of a display device according to an exemplary embodiment of the present disclosure. For the convenience of description, among various components of the display device, in FIG. 1A, only a substrate 110, a display area DA, a non-display area NDA, and a plurality of sub pixels SP are illustrated. Further, in FIG. 1B, a substrate 110, a display area DA, a non-display area NDA, and a touch sensor unit 150 are illustrated.

Referring to FIG. 1A, the display device 100 includes the substrate 110. The display device 100 may be implemented as a top emission type display device, but is not limited thereto.

The substrate 110 is a substrate which supports and protects various components of the display device 100. The substrate 110 may be formed of a glass or a plastic material having flexibility. When the substrate 110 is formed of a plastic material, for example, the substrate may be formed of polyimide (PI), but it is not limited thereto.

The substrate 110 includes a display area DA and a non-display area NDA.

The display area DA is an area in which an image is displayed in the display device 100 and a display element and various driving elements for driving the display element may be disposed in the display area DA. For example, the display element may be configured by a light emitting diode including a first electrode, an organic layer, and a second electrode. Further, various driving elements for driving the display element, such as transistors, capacitors, or wiring lines may be disposed in the display area DA.

A plurality of sub pixels SP may be included in the display area DA. The sub pixel SP is a minimum unit which configures a screen and each of the plurality of sub pixels SP may include a light emitting diode and a driving circuit. Each of the plurality of sub pixels SP may emit light having different wavelengths from each other. The plurality of sub pixels may include first to third sub pixels which emit different color light from each other. For example, the plurality of sub pixels SP may include a red sub pixel SPR which is a first sub pixel, a green sub pixel SPG which is a second sub pixel, and a blue sub pixel SPB which is a third sub pixel. Further, the plurality of sub pixels SP may also further include a white sub pixel.

The driving circuit of the sub pixel SP is a circuit for controlling the driving of the light emitting diode. For example, the driving circuit may be configured to include a transistor and a capacitor, but is not limited thereto.

The non-display area NDA is an area where no image is displayed and various components for driving the plurality of sub pixels SP disposed in the display area DA may be disposed in the non-display area NDA. For example, a driving IC which supplies a signal for driving the plurality of sub pixels SP and a flexible film may also be disposed.

The non-display area NDA may be an area which encloses the display area DA as illustrated in FIG. 1A. However, the present disclosure is not limited thereto. For example, the non-display area NDA may also be an area extending from the display area DA.

Referring to FIG. 1B, the display device 100 includes a touch sensor unit 150 for touch sensing. The touch sensor unit 150 includes a plurality of touch driving lines **150*a* to which a touch driving signal is applied and a plurality of touch sensing lines 150*b* which generates a touch signal. The plurality of touch driving lines 150*a* and the plurality of touch sensing lines 150*b*** may be disposed in the display area DA.

The plurality of touch driving lines **150*a* and the plurality of touch sensing lines 150*b* may be disposed to intersect each other. A mutual capacitance Cm is formed at an intersection of the touch driving line 150***a* and the touch sensing line 150*b*. Therefore, the mutual capacitance serves as a touch sensor by charging charges by a touch driving signal supplied to the touch driving line 150*a* and discharging the charged charges to the touch sensing line 150*b*.

A plurality of touch electrodes 151 and a plurality of bridge electrodes 152 are disposed in a plurality of touch driving lines 150*a* and a plurality of touch sensing lines 150*b*, respectively. The plurality of touch electrodes 151 is disposed along a first direction or a second direction intersecting the first direction to be spaced apart from each other with a predetermined interval. The plurality of bridge electrodes 152 is disposed on a different layer from the plurality of touch electrodes 151 to be electrically connected to the plurality of touch electrodes 151 through a contact hole CH.

Further, the plurality of touch electrodes 151 may also include a plurality of first touch electrodes and a plurality of second touch electrodes. The plurality of first touch electrodes is disposed in the plurality of touch driving lines 150*a* and is spaced apart from each other with a predetermined interval along the first direction. The plurality of second touch electrodes is disposed in the plurality of touch sensing lines 150*b* and is spaced apart from each other with a predetermined interval along the second direction intersecting the first direction. But the exemplary embodiment is not limited thereto.

In the meantime, even though in FIG. 1B, it is illustrated that each of the plurality of touch electrodes 151 has a rhombus shape, the plurality of touch electrodes 151 may be implemented to have various shapes, such as a circle, an oval, and a polygonal shape, but is not limited thereto.

In the non-display area NDA, a touch pad connected to a touch driver and a plurality of touch lines TW for connecting the touch pad and the plurality of touch driving lines 150*a* and the touch sensing lines 150*b* may be disposed. Further, the touch line TW may be electrically connected to the touch pad to transmit the touch information sensed by the touch sensor unit 150 to the driving IC.

Figure 2A:
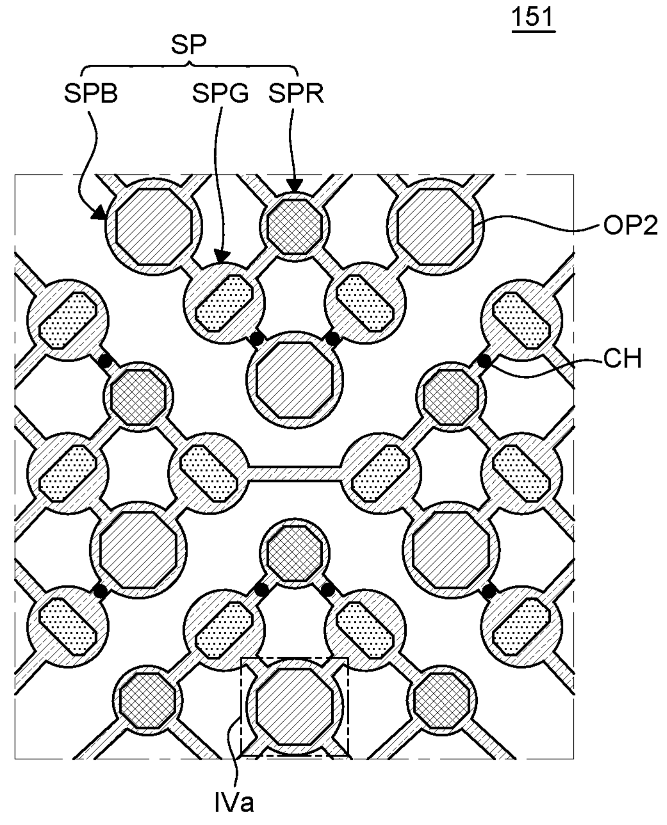
FIG. 2A is an enlarged plan view of a touch electrode of a display device according to an exemplary embodiment of the present disclosure.
Figure 2B:
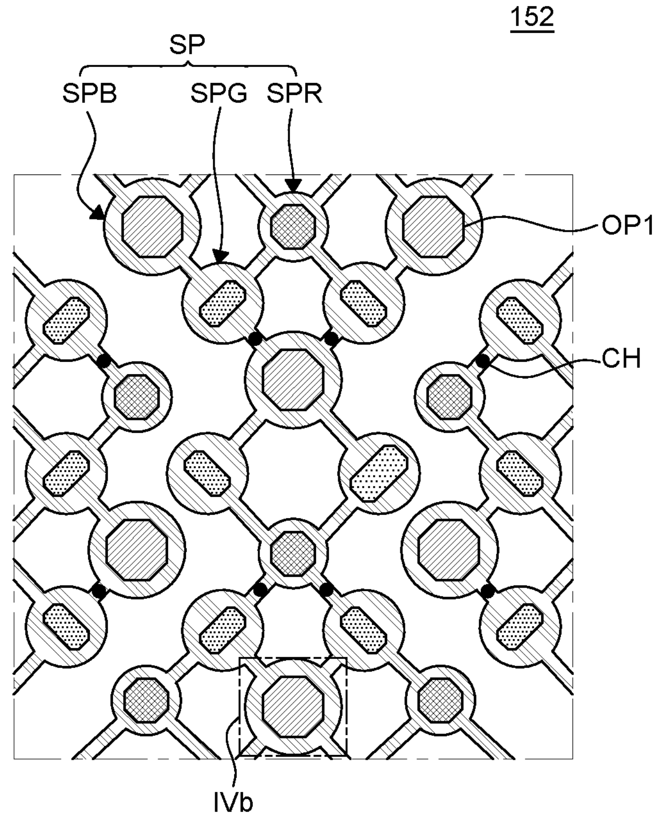
FIG. 2B is an enlarged plan view of a bridge electrode of a display device according to an exemplary embodiment of the present disclosure.

FIG. 2A is an enlarged plan view of a touch electrode of a display device according to an exemplary embodiment of the present disclosure. FIG. 2B is an enlarged plan view of a bridge electrode of a display device according to an exemplary embodiment of the present disclosure. For the convenience of description, among various components of the display device 100, in FIG. 2A, only the plurality of touch electrodes 151 is illustrated and in FIG. 2B, only a plurality of bridge electrodes 152 is illustrated.

Referring to FIGS. 2A and 2B, the plurality of touch electrodes 151 is disposed so as to overlap the plurality of bridge electrodes 152 and is electrically connected to the plurality of bridge electrodes 152 through the contact hole CH. Therefore, the plurality of touch electrodes 151 is electrically connected to the plurality of bridge electrodes 152 and a resistance may be reduced.

Referring to FIGS. 2A and 2B, the plurality of touch electrodes 151 and the plurality of bridge electrodes 152 are disposed with a mesh structure. A plurality of sub pixels SP is disposed in each of an intersection of the mesh structure of the plurality of touch electrodes 151 and the plurality of bridge electrodes 152.

The plurality of bridge electrodes 152 has a first opening OP1 corresponding to each of the intersections of the mesh structure. Each first opening OP1 may correspond to an emission area of one of the plurality of sub pixels SP. For example, each first opening OP1 may correspond to an emission area of one of a red sub pixel SPR, a green sub pixel SPG, and a blue sub pixel SPB, but is not limited thereto.

The plurality of touch electrodes 151 has a second opening OP2 corresponding to each of the intersections of the mesh structure. Each second opening OP2 may correspond to an emission area of one of the plurality of sub pixels SP. For example, each second opening OP2 may correspond to an emission area of one of a red sub pixel SPR, a green sub pixel SPG, and a blue sub pixel SPB, but is not limited thereto.

In the meantime, referring to FIGS. 2A and 2B, the second opening OP2 of the touch electrode 151 is larger than the first opening OP1 of the bridge electrode 152. Therefore, a size of the bridge electrode 152 may be larger than a size of the touch electrode 151 disposed on the bridge electrode 152.

Figure 3A:
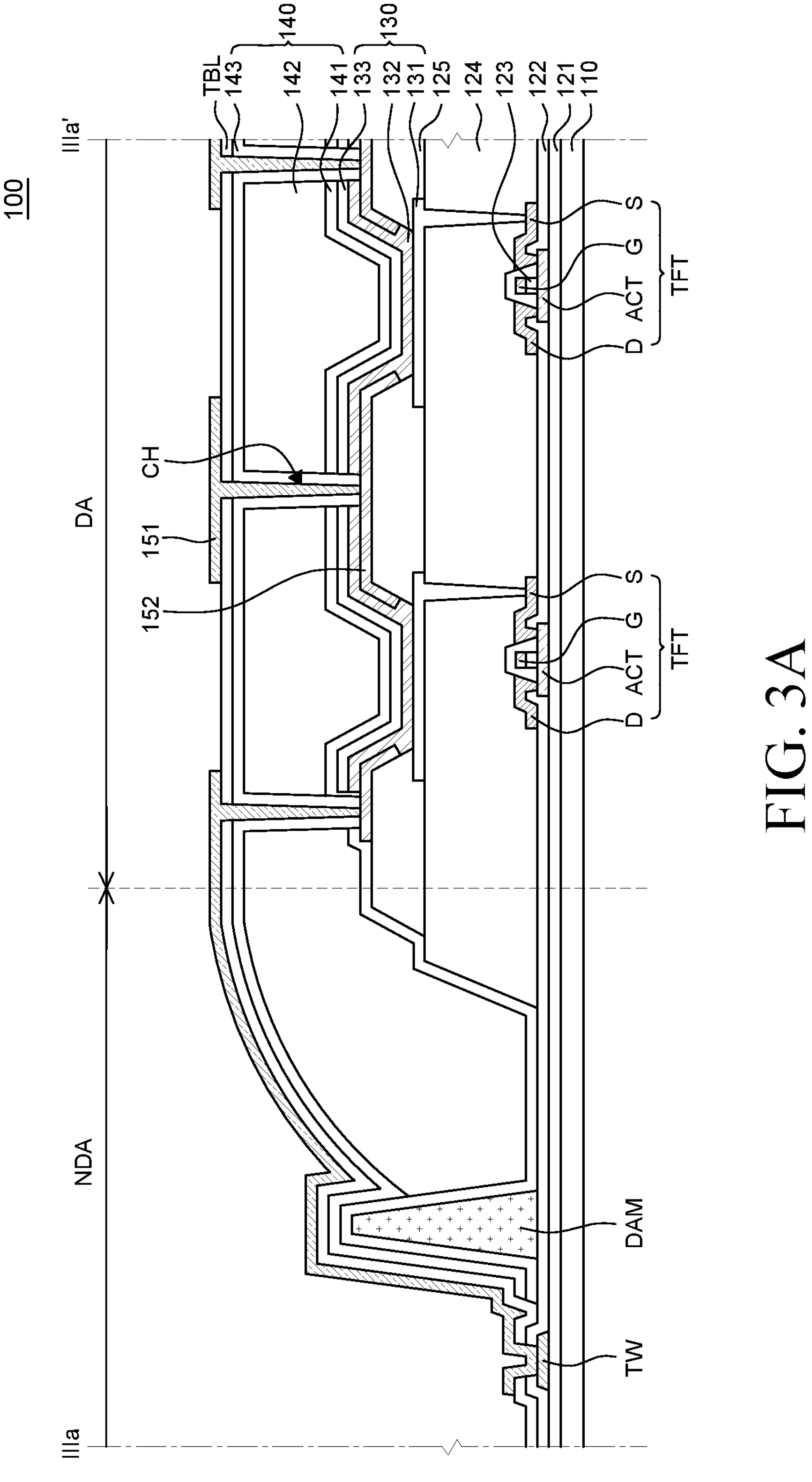
FIG. 3A is a cross-sectional view of a display device taken along the line IIIa-IIIa' of FIG. 1A according to an exemplary embodiment of the present disclosure.
Figure 3B:
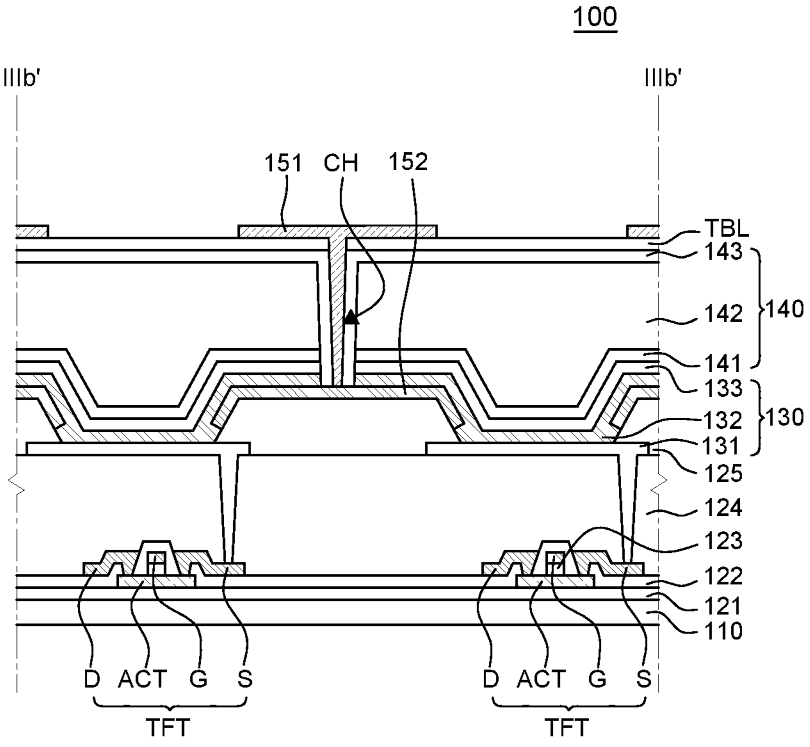
FIG. 3B is a cross-sectional view of a display device taken along the line IIIb-IIIb' of FIG. 1A according to an exemplary embodiment of the present disclosure.

FIG. 3A is a cross-sectional view of a display device taken along the line IIIa-IIIa' of FIG. 1A. FIG. 3B is a cross-sectional view of a display device taken along IIIb-IIIb' of FIG. 1A. FIG. 3A is a cross-sectional view for explaining a non-display area NDA adjacent to a display area DA and FIG. 3B is a cross-sectional view for explaining a plurality of sub pixels SP of the display area DA.

Referring to FIGS. 3A and 3B, a buffer layer 121 is disposed on the substrate 110. The buffer layer 121 may improve adhesiveness between layers formed on the buffer layer 121 and the substrate 110 and block impurities introduced from the substrate 110 into the thin film transistor TFT. Further, the buffer layer 121 may suppress or delay the spreading of the moisture and/or oxygen penetrating from the outside of the substrate 110 into the thin film transistor TFT. For example, the buffer layer 121 may be formed of a single layer or a plurality of layers including an inorganic insulating material, such as silicon nitride (SiNx) or silicon oxide (SiOx). The buffer layer 121 may also be omitted depending on a type of the substrate 110 and a structure of the thin film transistor.

A thin film transistor TFT including a gate electrode G, an active layer ACT, a source electrode S, and a drain electrode D is disposed on the buffer layer 121. The thin film transistor TFT is disposed in each of the plurality of sub pixel SP areas. In the drawing, only a driving thin film transistor, among various thin film transistors which may be included in the display device 100, is illustrated. Further, even though in the drawing, it is illustrated that the thin film transistor TFT has a coplanar structure, it is not limited thereto and the thin film transistor may have various structures such as a staggered structure.

An active layer ACT is disposed on the buffer layer 121 and a gate insulating layer 122 is disposed on the active layer ACT to insulate the active layer ACT and the gate electrode G from each other. Further, an interlayer insulating layer 123 is disposed on the buffer layer 121 to insulate the gate electrode G from the source electrode S and the drain electrode D. The source electrode S and the drain electrode D which are in contact with the active layer ACT are formed on the interlayer insulating layer 123.

In the meantime, referring to FIG. 3A, a dam DAM and the touch line TW are disposed on the gate insulating layer 122 of the non-display area NDA.

The dam DAM is disposed in the non-display area NDA adjacent to the display area DA. The dam DAM controls the flow of a composition for forming an organic encapsulation layer 142 having a larger mobility when the organic encapsulation layer 142 to be described below is formed. The dam DAM may control the flow of a composition for forming an organic encapsulation layer 142 so as not to invade a pad unit in which a signal line, such as a data line and a gate line, is formed. For example, the dam DAM may be formed in a line shape to extend along the non-display area NDA. In the meantime, the dam DAM may also be configured by a plurality of layers formed by laminating the same material as the insulating layer of the display device or a plurality of dams DAM may also be disposed, but is not limited thereto.

The touch line TW is disposed at the outside of the dam DAM in the non-display area NDA. The touch line TW is disposed to connect the touch driving line 150*a* or the touch sensing line 150*b* and the touch pad. That is, one end of the touch line TW is connected to the touch driving line 150*a* or the touch sensing line 150*b* and the other end may be connected to the touch pad. Therefore, the touch driving line 150*a* and the touch sensing line 150*b* are electrically connected to the touch pad to be supplied with an electric signal.

A planarization layer 124 is disposed on the thin film transistor TFT of the display area DA. The planarization layer 124 covers the thin film transistor TFT to planarize an upper portion. Therefore, the planarization layer 124 may also be referred to as an over coating layer. The planarization layer 124 may include a contact hole which electrically connects the thin film transistor TFT and the anode 131.

The light emitting diode 130 is disposed on the planarization layer 124. The light emitting diode 130 includes an anode 131, an organic layer 132, and a cathode 133.

The anode 131 is disposed on the planarization layer 124 and may be separated for every sub pixel SP. The anode 131 is electrically connected to the source electrode S of the thin film transistor TFT. For example, the anode 131 may be electrically connected to the source electrode S through a contact hole formed in the planarization layer 124. The anode 131 is a component for supplying holes to the organic layer 132 and may be formed of a conductive material having a high work function. For example, the anode 131 may be formed of one or more materials selected from transparent conductive oxides such as indium tin oxide (ITO), indium zinc oxide (IZO), indium tin zinc oxide (ITZO), tin oxide ($SnO_2$), zinc oxide (ZnO), indium copper oxide (ICO), and aluminum:zinc oxide (Al:ZnO, AZO), but is not limited thereto. When the display device 100 is driven as a top emission type, the anode 131 may further include a reflection layer which reflects light emitted from the organic layer 132 toward the cathode 133.

A bank 125 is disposed on the anode 131 and the planarization layer 124. The bank 125 may be formed to expose at least a part of the planarization layer 124 with an inclined surface. Further, the bank 125 is disposed between the plurality of sub pixels SP and covers an end of the anode 131 to expose at least a part of the anode 131. The bank 125 is formed to divide an emission area in which the light is emitted, in the sub pixels SP. That is, the bank 125 is formed between the emission areas of adjacent sub pixels SP to define a non-emission area. The bank 125 may be formed of an insulating material which insulates anodes 131 of adjacent sub pixels SP from each other. Further, the bank 125 may also be formed of a black insulation resin having a high light absorbance to suppress color mixture between adjacent sub pixels SP1.

The plurality of bridge electrodes 152 is disposed in a part of the surface of the bank 125. The plurality of bridge electrodes 152 is respectively disposed in a part of the surface of the bank 125 between the plurality of sub pixels SP. Referring to FIGS. 3A and 3B, the plurality of bridge electrodes 152 is disposed in a part of the inclined surface of the bank 125 and a top surface of the bank 125. The plurality of bridge electrodes 152 is disposed to be spaced apart from the anode 131. Therefore, the plurality of bridge electrodes 152 may be configured so as not to be electrically connected to the anode 131.

The plurality of bridge electrodes 152 is disposed on the inclined surface of the bank 125 to upwardly reflect light emitted from the light emitting diode 130. The light generated in the organic layer 132 of the light emitting diode 130 may be emitted not only upwardly, but also laterally. The light which is laterally emitted is directed to the inside of the display device 100 or may be trapped in the display device 100 due to the total reflection, or further travels to the inside of the display device 100 and then may also be disappeared. Therefore, the plurality of bridge electrodes 152 is disposed to cover a part of the inclined surface of the bank 125 below the organic layer 132 to change a traveling direction of light which is directed to a side portion of the organic layer 132 to a front direction. The bridge electrode 152 may also be referred to as a reflective electrode, but is not limited thereto.

For example, the plurality of bridge electrodes 152 may also be formed of a metal material, such as aluminum (Al), silver (Ag), copper (Cu), and a magnesium-silver alloy (Mg:Ag), but is not limited thereto.

The organic layer 132 is disposed on the anode 131, the bank 125, and the plurality of bridge electrodes 152. The organic layer 132 is a layer in which electrons and holes are coupled to emit light and is disposed to emit light having a color corresponding to each sub pixel SP.

The organic layer 132 is disposed on a top surface of the anode 131 which is exposed by the bank 125, a part of the surface of the bank 125, and surfaces of the plurality of bridge electrodes 152. For example, the organic layer 132 is disposed on the anode 131 in the emission area and is disposed on the bank 125 and the plurality of bridge electrodes 152 in the non-emission area. The organic layer 132 may be disposed in accordance with the shapes of the anode 131, the bank 125, and the plurality of bridge electrodes 152.

The organic layer 132 includes an emission layer and a common layer. The emission layer is an organic layer which emits light with a specific color. Different emission layers may also be disposed in each of the plurality of sub pixels SP or the same emission layer may also be disposed in all the plurality of sub pixels SP. For example, when different emission layers from each other are disposed in the plurality of sub pixels SP, a red emission layer is disposed in a red sub pixel SPR, a green emission layer is disposed in the green sub pixel SPG, and a blue emission layer may be disposed in the blue sub pixel SPB. When the same emission layer is disposed in all the plurality of sub pixels SP, light from the emission layer may also be converted to various color light through a separate color conversion layer and a color filter.

The cathode 133 is disposed on the organic layer 132. The cathode 133 is not patterned for each of the sub pixels SP, but may be formed as one layer to cover the organic layer 132 and the bank 125. That is, the cathode 133 may be formed as a single layer over the areas of the plurality of sub pixels SP. The cathode 133 may be formed of a metal material having a low work function to smoothly supply electrons to the organic layer 132. For example, the cathode 133 may be formed of a metal material selected from calcium (Ca), barium (Ba), aluminum (Al), and silver (Ag), and alloys including one or more of them, but is not limited thereto. When the display device 100 is driven as a top emission type, the cathode 133 is formed to have a very small thickness to be substantially transparent.

The encapsulation layer 140 is disposed on the cathode 133. The encapsulation layer 140 may minimize or at least reduce degradation of the components of the display device 100 due to the moisture or oxygen. Further, the encapsulation layer 140 planarizes an upper surface of the light emitting diode 130. The encapsulation layer 140 may be formed with a multi-layered structure in which inorganic encapsulation layers 141 and 143 and an organic encapsulation layer 142 are laminated. For example, the encapsulation layer 140 is configured by at least one organic encapsulation layer 142 and at least two inorganic encapsulation layers 141 and 143 and may have a structure in which the organic encapsulation layer 142 is laminated between the inorganic encapsulation layers 141 and 143. That is, the encapsulation layer 140 may include a multi-layered structure including a first inorganic encapsulation layer 141, an organic encapsulation layer 142 on the first inorganic encapsulation layer 141, and a second inorganic encapsulation layer 143 on the organic encapsulation layer 142, but is not limited thereto. For example, the first inorganic encapsulation layer 141 and the second inorganic encapsulation layer 143 may be independently formed of one or more selected from silicon nitride (SiNx), silicon oxide (SiOx), silicon oxynitride (SiON), and aluminum oxide ($Al_2O_3$). Further, the organic encapsulation layer 142 may be formed of one or more selected from epoxy resin, polyimide, polyethylene, and silicon resin, but is not limited thereto.

A touch buffer layer TBL is disposed on the second inorganic encapsulation layer 143. The touch buffer layer TBL is disposed between the second inorganic encapsulation layer 143 and the touch electrode 151 to improve the adhesiveness between the encapsulation layer 140 and the touch electrode 151. Further, when the touch sensor unit 150 is formed, the touch buffer layer TBL is disposed to protect the organic light emitting diode 130 and a signal line and a pad unit disposed in the non-display area NDA to drive the organic light emitting diode. Therefore, the touch buffer layer TBL is formed to extend from the display area DA to at least a part of the non-display area NDA. The touch buffer layer TBL may be formed of an insulating material which may be formed at a low temperature to suppress a damage to the light emitting diode 130 which is vulnerable to the high temperature and has a low permittivity.

The plurality of touch electrodes 151 is disposed on the touch buffer layer TBL. The touch electrode 151 overlaps the bridge electrode 152 and is electrically connected to the bridge electrode 152. Specifically, the touch electrode 151 may be electrically connected to the bridge electrode 152 through contact holes CH formed in the organic layer 132, the cathode 133, the first inorganic encapsulation layer 141, the organic encapsulation layer 142, the second inorganic encapsulation layer 143, and the touch buffer layer TBL. In the meantime, the second inorganic encapsulation layer 143 covers side surfaces of the organic layer 132, the cathode 133, the first inorganic encapsulation layer 141, and the organic encapsulation layer 142 penetrated by the contact hole CH. Therefore, the second inorganic encapsulation layer 143 may insulate the organic layer 132 and the cathode 133 from the plurality of touch electrodes 151.

For example, the plurality of touch electrodes 151 may be formed by a transparent conductive metal oxide, such as indium tin oxide or indium zinc oxide or a metal material, such as aluminum (Al), titanium (Ti), or copper (Cu), but is not limited thereto.

The plurality of touch electrodes 151 may be disposed so as not to overlap emission areas of the plurality of sub pixels SP. That is, a size of the plurality of touch electrodes 151 is smaller than a size of the plurality of bridge electrodes 152 disposed in a part of the surface of the bank 125 so as not to overlap the emission areas of the plurality of sub pixels SP. Therefore, the plurality of touch electrodes 151 may be configured so as not to affect the emission of the plurality of sub pixels SP.

In the meantime, even though it is not illustrated, a touch planarization layer is disposed on the touch buffer layer TBL and the plurality of touch electrodes 151 and a color filter may be disposed on the touch planarization layer.

The touch planarization layer covers upper portions of the touch buffer layer TBL and the plurality of touch electrodes 151 to planarize the upper portions of the plurality of touch electrodes 151. For example, the touch planarization layer may be formed of one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

The color filter is a configuration which converts light emitted from the emission layer into various colors. For example, when the emission layer is formed as the same layer over all the plurality of sub pixels SP, the color filter may convert light from the emission layer into various color light.

Figures 4A, 4B:
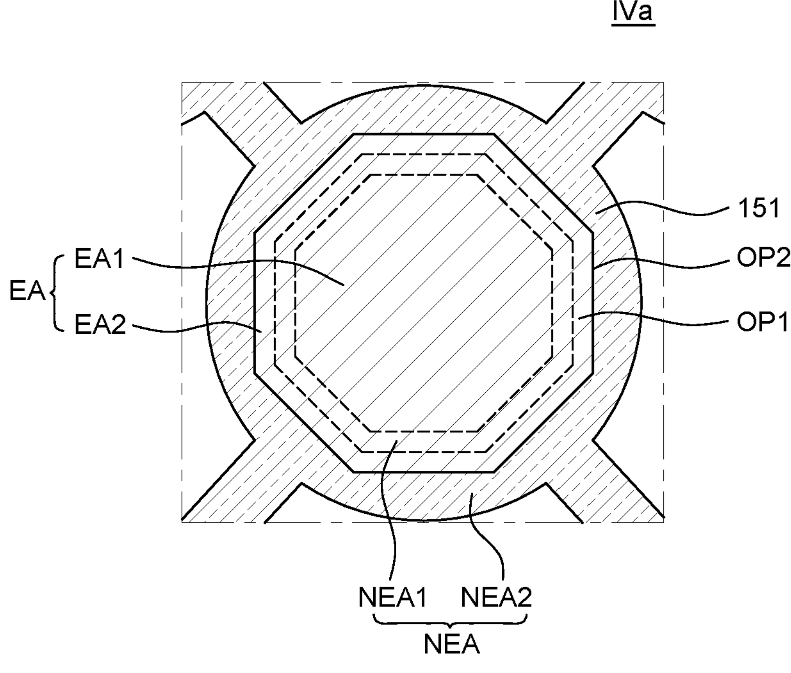
FIG. 4A is an enlarged plan view of a display device taken along Iva of FIG. 2A according to an exemplary embodiment of the present disclosure.
FIG. 4B is an enlarged plan view of a display device taken along Ivb of FIG. 2B according to an exemplary embodiment of the present disclosure.

FIG. 4A is an enlarged plan view of a display device taken along IVa of FIG. 2A. FIG. 4B is an enlarged plan view of a display device taken along IVb of FIG. 2B.

Referring to FIGS. 4A and 4B, at least one sub pixel SP, among the plurality of sub pixels SP disposed in the display area DA, includes an emission area EA and a non-emission area NEA. One sub pixel SP may include at least one emission area EA and at least two emission units EA1 and EA2.

For example, the emission area EA includes a first emission area EAl and a second emission area EA2 which encloses the first emission area EA1. The non-emission area NEA may include a first non-emission area NEAl between the first emission area EAl and the second emission area EA2 and a second non-emission area NEA2 which encloses the second emission area EA2.

The first emission area EAl may correspond to an area in which a top surface of the anode 131 is exposed by the bank 125. That is, the first emission area EAl may be an area in which some of light emitted from the organic layer 132 is extracted to the outside of the display device 100 via the organic layer 132 and the cathode 133.

The first emission area EAl may be enclosed by the first non-emission area NEA1. The first non-emission area NEAl may be an area in which some of light emitted from the organic layer 132 reaches the bank 125 so that the light is not extracted to the outside of the display device 100. The first non-emission area NEAl corresponds to an area in which the anode 131 is covered by the bank 125 and may correspond to an inclined surface of the bank 125 in which the plurality of bridge electrodes 152 is not disposed. Therefore, the first opening OP1 of the plurality of bridge electrodes 152 may overlap the first emission area EA1 enclosed by the first non-emission area NEA1. The second opening OP2 of the plurality of touch electrodes 151 may overlap at least the first non-emission area NEA1 of the non-emission area NEA.

When the display device 100 is on, the first non-emission area NEA1 is in a black state or may have a luminance lower than those of the first emission area EAl and the second emission area EA2 due to light incident from at least one light emitting unit, of the first emission area EA1 and the second emission area EA2.

The first non-emission area NEAl may be enclosed by the second emission area EA2. The second emission area EA2 may correspond to an area in which the plurality of bridge electrodes 152 is disposed on the inclined surface of the bank 125. That is, the second emission area EA2 may be an area in which some of light emitted from the organic layer 132 reaches the inclined surface of the bank 125 to be reflected by the plurality of bridge electrodes 152 to be extracted to the outside of the display device 100. Therefore, the plurality of bridge electrodes 152 may overlap the second emission area EA2.

The second emission area EA2 may be enclosed by the second non-emission area NEA2. The second non-emission area NEA2 may correspond to flat top surfaces of the bank 125 and the plurality of bridge electrodes 152. The second non-emission area NEA2 may be an area in which components for driving the emission area EA are disposed.

In the second non-emission area NEA2, the plurality of touch electrodes 151 may be disposed. Therefore, even though the plurality of touch electrodes 151 includes an opaque conductive material, the plurality of touch electrodes does not overlap the emission area EA so that the size of the emission area EA may not be reduced.

When the display device 100 is on, the second non-emission area NEA2 is in a black state or may have a luminance lower than those of the first emission area EAl and the second emission area EA2 due to light incident from at least one light emitting unit, of the first emission area EAl and the second emission area EA2. Further, when the luminance of the second non-emission area NEA2 is lower than the luminance of each of the first emission area EAl and the second emission area EA2, the luminance of the first non-emission area NEA1 may be higher than the luminance of the second non-emission area NEA2, but is not limited thereto.

The display device 100 according to the exemplary embodiment of the present disclosure uses the plurality of bridge electrodes 152 disposed on the inclined surface of the bank 125 to improve the light extraction efficiency of the light emitting diode 130. For example, in the display device 100 according to the exemplary embodiment of the present disclosure, the plurality of bridge electrodes 152 which is formed of a metal material and is configured to change a traveling direction of light which is directed to a side portion of the organic layer 132 into a front direction is disposed on the inclined surface of the bank 125. Accordingly, light emitted at a low emission angle, among light emitted from the emission layer of the display device 100 may be extracted to the outside by the plurality of bridge electrodes 152 disposed on the inclined surface of the bank 125. Accordingly, in the display device 100 according to the exemplary embodiment of the present disclosure, the plurality of bridge electrodes 152 disposed on the inclined surface of the bank 125 serves as a side mirror to extract the light which may be lost in the display device 100 to the outside. As a result, the light extraction efficiency is improved and power consumption may be improved.

The display device 100 according to the exemplary embodiment of the present disclosure uses an electrode disposed to extract light of the light emitting diode 130 to the outside as the bridge electrode of the touch sensor unit 150 to simplify the manufacturing process of the display device 100 and simplify the structure of the display device 100.

Specifically, in the display device 100 according to the exemplary embodiment of the present disclosure, the plurality of bridge electrodes 152 which is formed of a metal material and is configured to change a traveling direction of light which is directed to a side portion of the organic layer 132 into a front direction is disposed on the inclined surface of the bank 125. The plurality of touch electrodes 151 may be electrically connected to the bridge electrode 152 through contact holes CH formed in the organic layer 132, the cathode 133, the first inorganic encapsulation layer 141, the organic encapsulation layer 142, the second inorganic encapsulation layer 143, and the touch buffer layer TBL. Therefore, the plurality of bridge electrodes 152 is connected to the plurality of touch electrodes 151 to transmit an electric signal between the plurality of touch electrodes 151 and configure a touch sensor of the touch sensor unit 150. That is, the plurality of bridge electrodes 152 is a configuration in which a configuration of extracting the light of the light emitting diode 130 to the outside and a configuration of the bridge electrode of the touch sensor unit 150 are unified. Accordingly, a process and a space for disposing a component which serves to extract the light of the light emitting diode 130 to the outside and a component which serves as the bridge electrode of the touch sensor unit 150 may be saved. Accordingly, the display device 100 according to the exemplary embodiment of the present disclosure uses an electrode disposed to extract light of the light emitting diode 130 to the outside as the bridge electrode of the touch sensor unit 150 to simplify the manufacturing process of the display device 100 and simplify the structure of the display device 100.

Figure 5:
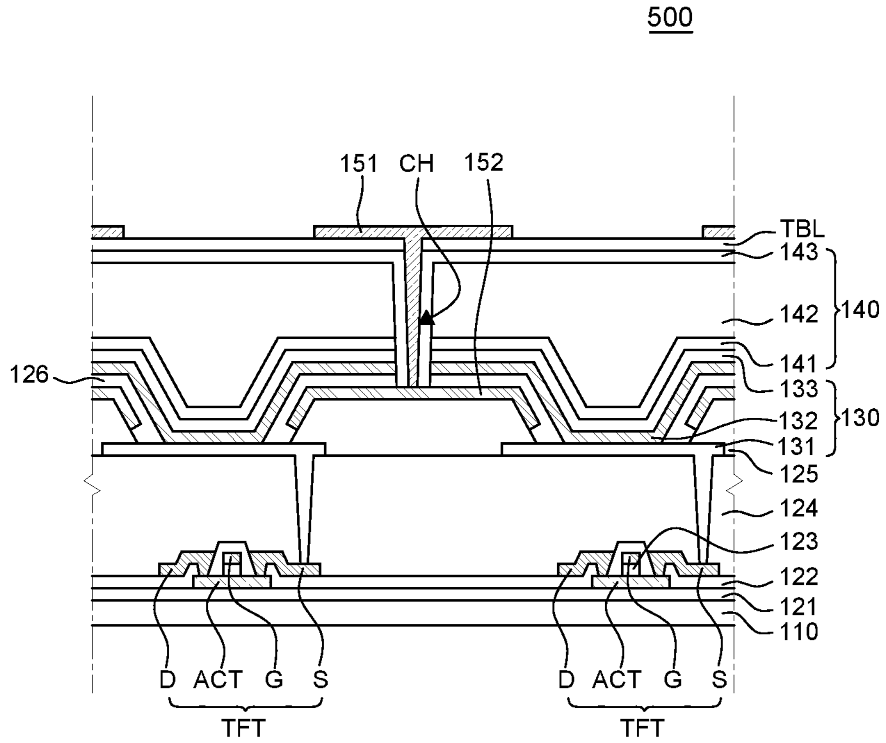
FIG. 5 is a cross-sectional view of a display device according to another exemplary embodiment of the present disclosure.

FIG. 5 is a cross-sectional view of a display device according to another exemplary embodiment of the present disclosure. The only difference between a display device 500 of FIG. 5 and the display device 100 of FIGS. 1A to 4B is that an inorganic insulating layer 126 is further disposed between the bridge electrode 152 and the organic layer 132, but the other configurations are substantially the same, so that a redundant description will be omitted.

Referring to FIG. 5, the inorganic insulating layer 126 is disposed between the plurality of bridge electrodes 152 and the organic layer 132. The inorganic insulating layer 126 is disposed so as to cover the end of the bridge electrode 152 adjacent to the anode 131.

The plurality of bridge electrodes 152 is disposed to be spaced apart from the anode 131 and is configured so as not to be electrically connected to the anode 131. The inorganic insulating layer 126 is disposed between the plurality of bridge electrodes 152 and the anode 131 to more stably insulate between the anode 131 and the bridge electrode 152. Further, the plurality of bridge electrodes 152 and the anode 131 are supplied with the electric signal to be stably functioned.

In the meantime, referring to FIG. 5, the second inorganic encapsulation layer 143 covers side surfaces of the inorganic insulating layer 126, the organic layer 132, the cathode 133, the first inorganic encapsulation layer 141, and the organic encapsulation layer 142. The second inorganic encapsulation layer 143 covers side surfaces of the inorganic insulating layer 126, the organic layer 132, the cathode 133, the first inorganic encapsulation layer 141, and the organic encapsulation layer 142 penetrated by the contact hole CH. Therefore, the second inorganic encapsulation layer 143 may insulate the inorganic insulating layer 126, the organic layer 132, and the cathode 133 from the plurality of touch electrodes 151.

Figure 6:
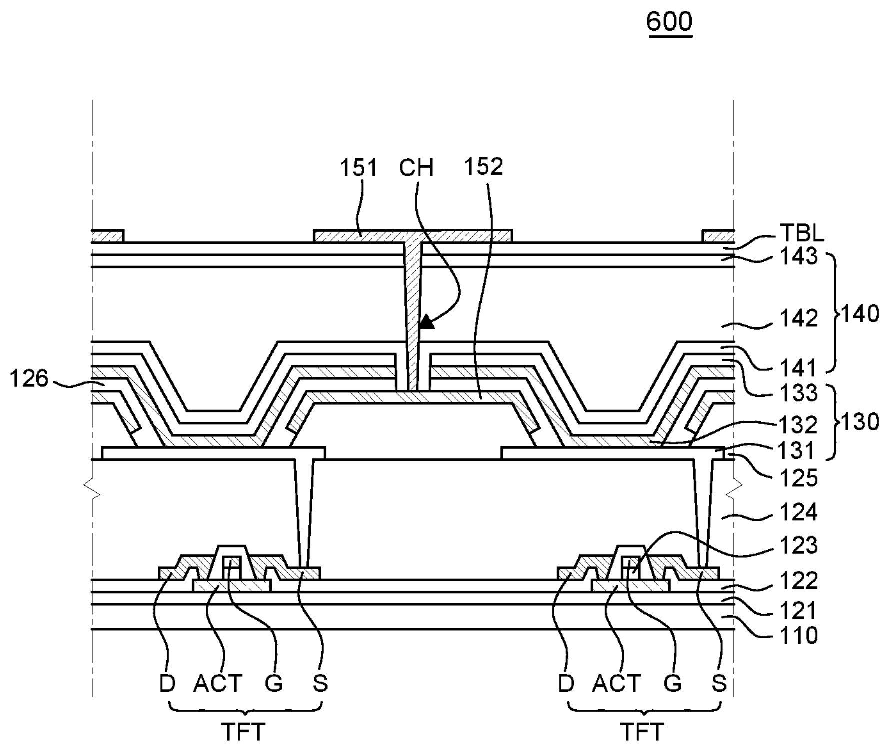
FIG. 6 is a cross-sectional view of a display device according to still another exemplary embodiment of the present disclosure.

FIG. 6 is a cross-sectional view of a display device according to still another exemplary embodiment of the present disclosure. The only difference between a display device 600 of FIG. 6 and the display device 500 of FIG. 5 is a placement structure of inorganic encapsulation layers 141 and 143 disposed above the bridge electrode 152, but the other configurations are substantially the same, so that a redundant description will be omitted.

Referring to FIG. 6, the first inorganic encapsulation layer 141 covers side surfaces of the inorganic insulating layer 126, the organic layer 132, and the cathode 133. The first inorganic encapsulation layer 141 covers side surfaces of the inorganic insulating layer 126, the organic layer 132, and the cathode 133 penetrated by the contact hole CH. Therefore, the first inorganic encapsulation layer 141 may insulate the inorganic insulating layer 126, the organic layer 132, and the cathode 133 from the plurality of touch electrodes 151.

The display device 600 according to still another exemplary embodiment of the present disclosure uses the first inorganic encapsulation layer 141 as a configuration for insulating the organic layer 132 and the cathode 133 from the plurality of touch electrodes 151. Therefore, the organic layer 132 and the cathode 133 are insulated from the plurality of touch electrodes 151 using the first inorganic encapsulation layer 141 disposed on the cathode 133 so that a process for manufacturing the display device 100 may be easier.

Figure 7:
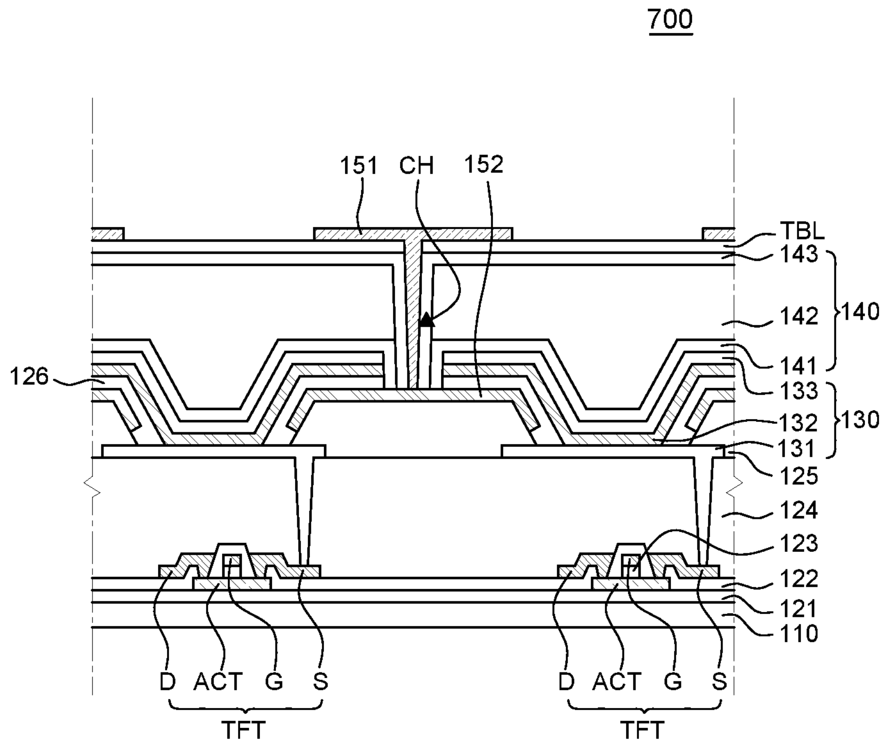
FIG. 7 is a cross-sectional view of a display device according to still another exemplary embodiment of the present disclosure.

FIG. 7 is a cross-sectional view of a display device according to still another exemplary embodiment of the present disclosure. The only difference between a display device 700 of FIG. 7 and the display device 500 of FIG. 5 is a placement structure of inorganic encapsulation layers 141 and 143 disposed above the bridge electrode 152, but the other configurations are substantially the same, so that a redundant description will be omitted.

Referring to FIG. 7, the first inorganic encapsulation layer 141 covers side surfaces of the inorganic insulating layer 126, the organic layer 132, and the cathode 133 and the second inorganic encapsulation layer 143 covers a side surface of the organic encapsulation layer 142. Specifically, the second inorganic encapsulation layer 143 covers a side surface of the organic encapsulation layer 142 which is not covered by the first inorganic encapsulation layer 141. Further, the first inorganic encapsulation layer 141 and the second inorganic encapsulation layer 143 are disposed to be in contact with each other on the bridge electrodes 152.

The display device 700 according to still another exemplary embodiment of the present disclosure uses the first inorganic encapsulation layer 141 and the second inorganic encapsulation layer 143 as a configuration for insulating the organic layer 132 and the cathode 133 from the plurality of touch electrodes 151. Therefore, the organic layer 132 and the cathode 133 are insulated from the plurality of touch electrodes 151 using the first inorganic encapsulation layer 141 disposed on the cathode 133 so that a process for manufacturing the display device 100 may be easier. Further, a side surface of the organic encapsulation layer 142 which is not covered by the first inorganic encapsulation layer 141 is configured to be covered by the second inorganic encapsulation layer 143 so that the plurality of touch electrodes 151 and the organic layer 132 and the cathode 133 may be more stably insulated.

The exemplary embodiments of the present disclosure can also be described as follows:

According to an aspect of the present disclosure, a display device includes a substrate including a plurality of sub pixels: an over coating layer disposed on the substrate: an anode which is disposed on the over coating layer so as to correspond to each of the plurality of sub pixels: a bank which is disposed to cover an end of the anode between the plurality of sub pixels and has an inclined surface: a bridge electrode which is disposed on a top surface of the bank between the plurality of sub pixels and a part of the inclined surface: an organic layer disposed on the anode and the bridge electrode: a cathode disposed on the organic layer: an encapsulation unit disposed on the cathode; and a touch electrode which is disposed on the encapsulation unit so as to overlap the bridge electrode and is electrically connected to the bridge electrode.

The bridge electrode may be spaced apart from the anode.

The bridge electrode may be formed of a metal material.

A size of the bridge electrode may be larger than a size of the touch electrode disposed on the bridge electrode.

The encapsulation unit may include a first inorganic encapsulation layer: an organic encapsulation layer disposed on the first inorganic encapsulation layer; and a second inorganic encapsulation layer disposed on the organic encapsulation layer.

The second inorganic encapsulation layer may cover side surfaces of the organic layer, the cathode, the first inorganic encapsulation layer, and the organic encapsulation layer.

The display device may further comprise an inorganic insulating layer disposed between the bridge electrode and the organic layer.

The inorganic insulating layer may cover an end of the bridge electrode adjacent to the anode.

The second inorganic encapsulation layer may cover side surfaces of the inorganic insulating layer, the organic layer, the cathode, the first inorganic encapsulation layer, and the organic encapsulation layer.

The first inorganic encapsulation layer may cover side surfaces of the inorganic insulating layer, the organic layer, and the cathode.

The first inorganic encapsulation layer may cover side surfaces of the inorganic insulating layer, the organic layer, and the cathode.

The second inorganic encapsulation layer may cover the side surface of the organic encapsulation layer.

The first inorganic encapsulation layer and the second inorganic encapsulation layer may be in contact with each other on the bridge electrode.

The display device may further comprise a touch buffer layer which is disposed between the second inorganic encapsulation layer and the touch electrode; and a touch planarization layer disposed on the touch buffer layer and the touch electrode.

The display device may further comprise a color filter disposed on the touch planarization layer.

According to another aspect of the present disclosure, a display device may include a substrate including a display area including a plurality of sub pixels: an over coating layer disposed on the substrate: a light emitting diode which is disposed on the over coating layer so as to correspond to each of the plurality of sub pixels and includes an anode, an organic layer, and a cathode; a bank which is disposed to cover an end of the anode between the plurality of sub pixels and has an inclined surface; a reflective electrode which is disposed in a part of a surface of the bank between the plurality of sub pixels: an encapsulation unit disposed on the light emitting diode; and a touch electrode which is disposed on the encapsulation unit and the reflective electrode and is electrically connected to the reflective electrode, and the reflective electrode has a first opening which overlaps the anode and the touch electrode has a second opening which overlaps the anode and is larger than the first opening.

A size of the reflective electrode may be larger than a size of the touch electrode disposed on the reflective electrode.

The display area may include an emission area and a non-emission area, the emission area includes a first emission area and a second emission area which encloses the first emission area.

The non-emission area may include a first non-emission area between the first emission area and the second emission area and a second non-emission area which encloses the second emission area.

The first opening may overlap the first emission area.

The second opening may overlap the emission area and at least the first non-emission area of the non-emission area.

The reflective electrode may overlap the second emission area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including a plurality of sub pixels;

an over coating layer on the substrate;

an anode on the over coating layer, the anode corresponding to one of the plurality of sub pixels;

a bank between the plurality of sub pixels, the bank covering an end of the anode and having an inclined surface;

a bridge electrode on a top surface of the bank between the plurality of sub pixels and on a part of the inclined surface;

an organic layer on the anode and the bridge electrode;

a cathode on the organic layer;

an encapsulation unit on the cathode; and a touch electrode on the encapsulation unit, the touch electrode overlapping the bridge electrode and electrically connected to the bridge electrode.

2. The display device according to claim 1, wherein the bridge electrode is spaced apart from the anode.

3. The display device according to claim 1, wherein the bridge electrode comprises a metal material.

4. The display device according to claim 1, wherein a size of the bridge electrode is larger than a size of the touch electrode on the bridge electrode.

5. The display device according to claim 1, wherein the encapsulation unit includes:

a first inorganic encapsulation layer;

an organic encapsulation layer on the first inorganic encapsulation layer; and a second inorganic encapsulation layer on the organic encapsulation layer, and wherein the touch electrode is electrically connected to the bridge electrode through contact holes in the first inorganic encapsulation layer, the organic encapsulation layer, and the second inorganic encapsulation layer.

6. The display device according to claim 5, wherein the second inorganic encapsulation layer covers side surfaces of the organic layer, the cathode, the first inorganic encapsulation layer, and the organic encapsulation layer.

7. The display device according to claim 5, further comprising:

an inorganic insulating layer between the bridge electrode and the organic layer.

8. The display device according to claim 7, wherein the inorganic insulating layer covers an end of the bridge electrode adjacent to the anode.

9. The display device according to claim 7, wherein the second inorganic encapsulation layer covers side surfaces of the inorganic insulating layer, the organic layer, the cathode, the first inorganic encapsulation layer, and the organic encapsulation layer.

10. The display device according to claim 7, wherein the first inorganic encapsulation layer covers side surfaces of the inorganic insulating layer, the organic layer, and the cathode.

11. The display device according to claim 7, wherein the first inorganic encapsulation layer covers side surfaces of the inorganic insulating layer, the organic layer, and the cathode, wherein the second inorganic encapsulation layer covers a side surface of the organic encapsulation layer, and wherein the first inorganic encapsulation layer and the second inorganic encapsulation layer are in contact with each other via the bridge electrode.

12. The display device according to claim 5, further comprising:

a touch buffer layer between the second inorganic encapsulation layer and the touch electrode; and a touch planarization layer on the touch buffer layer and the touch electrode.

13. The display device according to claim 12, further comprising:

a color filter on the touch planarization layer.

* * * * *